(12) United States Patent
Fong et al.

(10) Patent No.: US 7,436,661 B2
(45) Date of Patent: Oct. 14, 2008

(54) TWO-COMPARTMENT AC ADAPTOR

(75) Inventors: Chee Kiong Fong, Cupertino, CA (US); Daniel LaMotte Neal, Morgan Hill, CA (US); J. David Egner, Jr., Sammamish, WA (US); Roy James Askeland, Los Altos, CA (US)

(73) Assignee: Microsoft Corporation, Redmond, WA (US)

( * ) Notice: Subject to any disclaimer, the term of this patent is extended or adjusted under 35 U.S.C. 154(b) by 580 days.

(21) Appl. No.: 11/126,702

(22) Filed: May 11, 2005

(65) Prior Publication Data

US 2006/0255773 A1 Nov. 16, 2006

(51) Int. Cl.
*H05K 7/20* (2006.01)
*G05F 1/70* (2006.01)
*F22G 1/00* (2006.01)

(52) U.S. Cl. ........................ 361/695; 323/211; 363/146; 361/715; 361/690

(58) Field of Classification Search .................. None
See application file for complete search history.

(56) References Cited

U.S. PATENT DOCUMENTS

| | | | | |
|---|---|---|---|---|
| 5,185,691 A * | 2/1993 | Korinsky | ..................... | 361/720 |
| 5,831,847 A * | 11/1998 | Love | .......................... | 363/141 |
| 6,081,425 A * | 6/2000 | Cheng | ........................ | 361/704 |
| 6,820,686 B2 * | 11/2004 | Yang et al. | .................. | 165/185 |
| 7,027,300 B2 * | 4/2006 | Lord | .......................... | 361/695 |
| 7,142,423 B2 * | 11/2006 | Lanni | ......................... | 361/695 |
| 7,265,973 B2 * | 9/2007 | Lanni | ......................... | 361/695 |
| 7,289,320 B2 * | 10/2007 | Chang et al. | ................. | 361/690 |
| 2007/0247817 A1 * | 10/2007 | Huang | ........................ | 361/719 |

* cited by examiner

*Primary Examiner*—Gregory D Thompson
(74) *Attorney, Agent, or Firm*—Woodcock Washburn LLP

(57) ABSTRACT

An external AC power adaptor having an additional compartment for cooling. The adaptor has a housing that defines a first compartment having power circuitry for converting an AC input to a DC output and a second compartment that has an opening formed in the adaptor housing. A heat transfer plate is disposed between the first and second compartments.

20 Claims, 4 Drawing Sheets

TWO-COMPARTMENT AC ADAPTOR

FIELD OF THE INVENTION

The present invention relates generally to the field of consumer electronics. More particularly, the present invention relates to external AC adaptors.

BACKGROUND OF THE INVENTION

Many consumer products and other electrical devices need to convert an AC power input provided by electrical mains into a DC power output that is required by the device's circuitry. An external AC power adaptor is often used for such a purpose. In addition to performing its primary function of converting an AC input into a DC output having characteristics suitable for the device's circuitry, an external AC power adaptor provides several design advantages over an internal AC power adaptor.

For example, safety concerns and/or regulations dictate that the power circuitry of an AC power adaptor be housed in an appropriately secure manner to reduce the risk of user injury. Typically, any component that can become energized with AC power needs to have a secure housing that protects against inadvertent user contact with the energized component. By moving such power circuitry outside of a device, the device itself may not need to incorporate the same level of safety features because the device only uses the DC output of the adaptor. In addition, the device may be made smaller and lighter because the size and weight of the AC power adapter, along with its housing or other safety features, is located outside of the device.

An external AC power adaptor is typically located on a device's plug or in a "brick" configuration that may be located along the device's power cord. An example of the latter type of conventional external AC power adaptor is illustrated in FIG. 1. Power circuitry 115 is located within housing 120 of external AC power adapter 100. Power circuitry 115 receives AC power by way of wire 105 and outputs DC power by way of wire 110. As noted above, the presence of energized power circuitry 115 requires enhanced safety precautions. This is especially important for external AC power adaptors in general because such adaptors are typically placed on the floor, behind furniture, etc., under uncontrolled and unobserved conditions. As a result, external AC power adaptor 100 needs to be capable of withstanding a variety of physical stresses, including drops, spills, and so forth. In addition, housing 120 of adaptor 100 needs to be able to isolate any energized components from children, pets and the like that may unknowingly attempt to access such components. Most conventional external AC power adaptor 100 manufacturers have opted to deal with these safety issues by constructing such an adaptor 100 with housing 120 that is a sealed, resilient assembly with no ventilation provided to the interior components to prevent any possibility of contact with any energized components.

Unfortunately, all power supplies, and therefore all external AC power adaptors, generate some amount of interior heat. An external AC power adaptor having a sealed housing does not provide an efficient means for dissipating internal heat, which in turn limits the amount of power that can be economically delivered to a device without overheating the adaptor.

For example, plastic is usually the material used to construct housing 120 because it is a strong, low-cost electrical insulator having a favorable heat-rise allowance as dictated by applicable government agency standards. The interior heat-generating parts of power circuitry 115 must diffuse their heat load through such a plastic housing 120 into what is typically still air. Because plastic is a poor thermal conductor, and because still air results in poor thermal transfer, it can be seen that a conventional external AC power adaptor is severely limited in the amount of power it can supply for a given adaptor 100 size.

Accordingly, there is a need for a means by which an external AC power adaptor can provide an improved cooling mechanism while maintaining the inherent safety and hazard integrity provided by a sealed housing. The present invention satisfies this need.

SUMMARY OF THE INVENTION

In view of the foregoing shortcomings and drawbacks, an external AC power adaptor having an additional compartment for cooling is disclosed herein. The adaptor has a housing that defines a first compartment having power circuitry for converting an AC input to a DC output and a second compartment that has an opening formed in the adaptor housing. A heat transfer plate is disposed between the first and second compartments.

An external AC power adaptor is also disclosed that has a housing defining a first compartment having power circuitry for converting an AC input to a DC output, and a second compartment having a first and second opening. A heat transfer plate that is operatively coupled to the housing to enclose the first compartment, and is thermally coupled to the power circuitry, is disposed substantially between the first and second compartments. A fan is provided for moving air into the second compartment from the first opening, across the heat transfer plate and out of the second compartment through the second opening.

An apparatus for cooling an external AC power adaptor is also disclosed that has a compartment formed within the adaptor, where a portion of the compartment is defined by a heat transfer plate that is thermally coupled to power circuitry of the adaptor. A fan is provided for forcing air across the heat transfer plate.

BRIEF DESCRIPTION OF THE DRAWINGS

The foregoing summary, as well as the following detailed description of preferred embodiments, is better understood when read in conjunction with the appended drawings. For the purpose of illustrating the invention, there is shown in the drawings exemplary embodiments of the invention; however, the invention is not limited to the specific methods and instrumentalities disclosed. In the drawings.

DETAILED DESCRIPTION OF ILLUSTRATIVE EMBODIMENTS

The subject matter of the present invention is described with specificity to meet statutory requirements. However, the description itself is not intended to limit the scope of this patent. Rather, the inventors have contemplated that the claimed subject matter might also be embodied in other ways, to include different steps or elements similar to the ones described in this document, in conjunction with other present or future technologies. Moreover, although the term "step" may be used herein to connote different aspects of methods employed, the term should not be interpreted as implying any particular order among or between various steps herein disclosed unless and except when the order of individual steps is explicitly described. In addition, in the discussion that follows, it is assumed that one skilled in the art is familiar with details pertaining to external AC power adaptor wiring, circuitry and construction, and so such details are omitted herein for purposes of clarity.

As was noted above, conventional external AC power adaptors have the shortcoming that the resilient, tightly sealed plastic housing that provides safe containment of the power circuitry also inhibits the effective transfer of heat from heat-generating components of such adaptors to ambient air. Therefore, and according to an embodiment, an external AC power adaptor is provided that has a first compartment for containing power circuitry and a second compartment that enables air cooling with a surface that is a better heat conductor than the plastic (or other material) that makes up the adaptor's housing. The first and second compartments are separated by a heat transfer plate having thermal characteristics suitable for transferring heat from the power circuitry to the air plenum. The heat transfer plate may also be adapted to securely couple to the adapter housing to physically and electrically enclose the power circuitry for safety purposes. The second compartment may be vented to simply facilitate air cooling by way of thermal convection or the like, or may have a fan to provide forced-air cooling.

Figure 1:
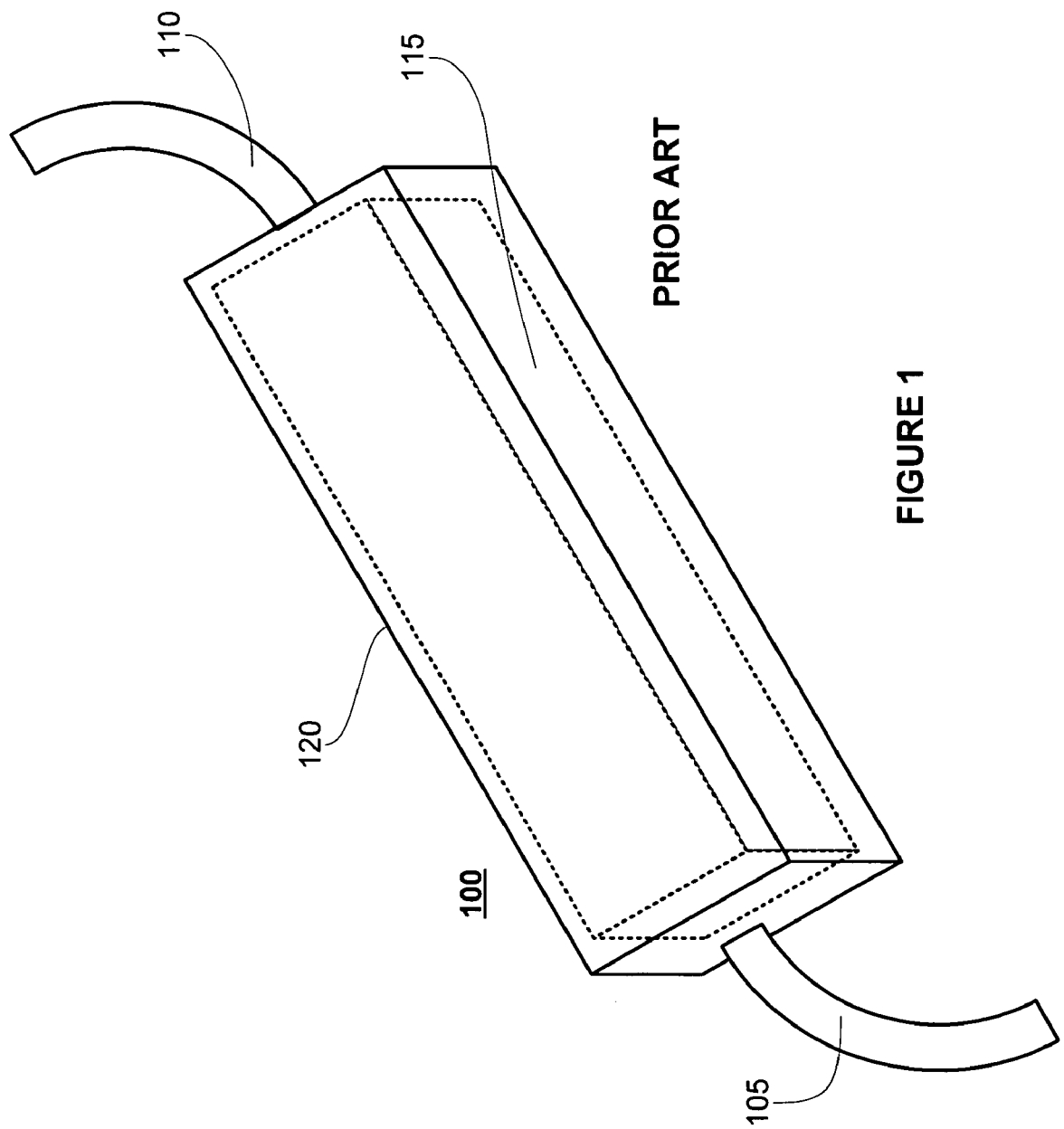
FIG. 1 is a diagram illustrating a perspective view of a conventional external AC power adaptor.
Figure 2:
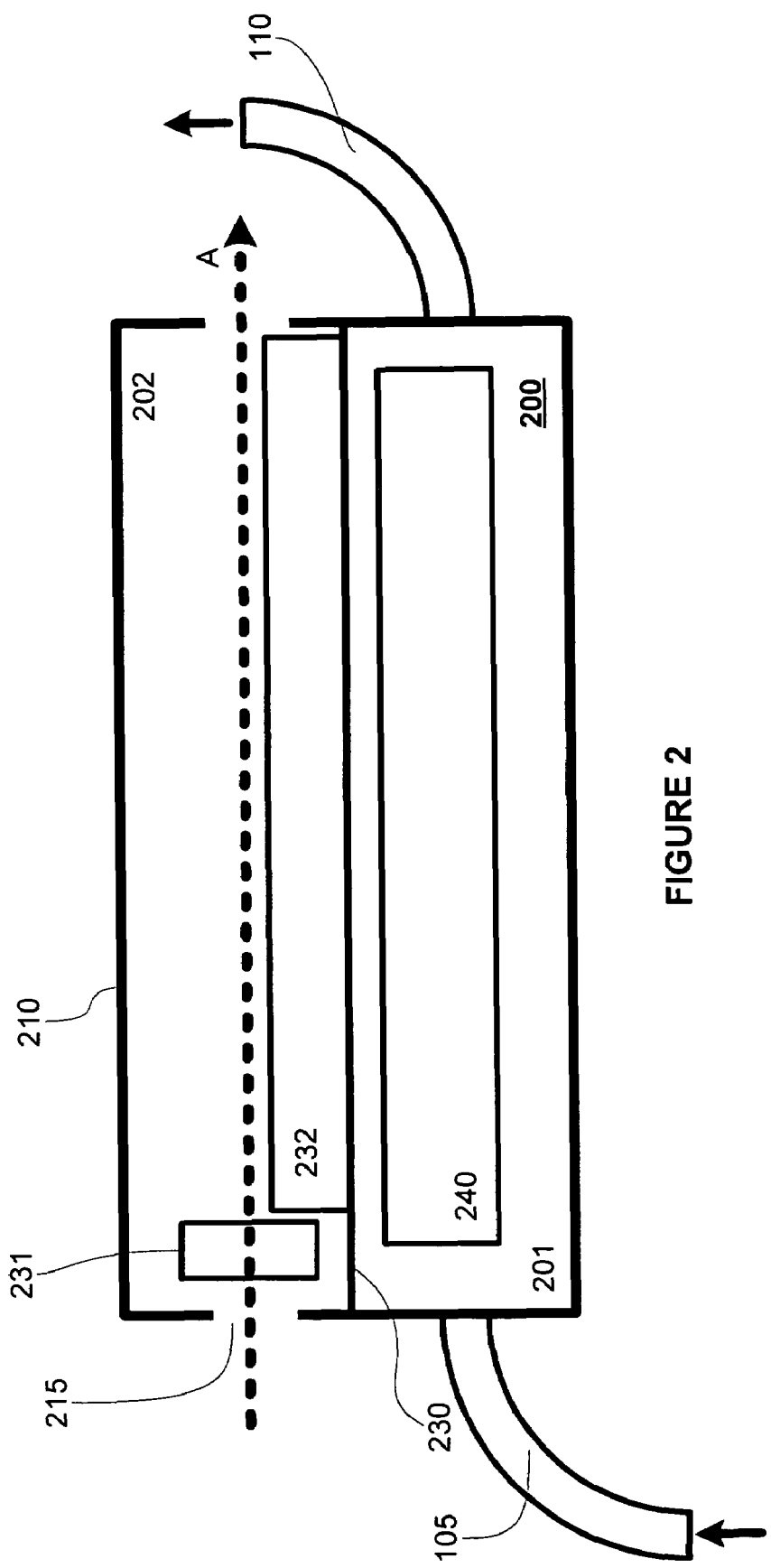
FIG. 2 is a diagram illustrating a cross-sectional view of an external AC power adaptor in accordance with an embodiment of the present invention.

FIG. 2 illustrates a cross-sectional view of an external AC power adaptor that is configured according to an embodiment of the present invention. In FIG. 2, external AC power adaptor 200 receives an AC input by way of wire 105. Power circuitry 240 converts the AC input to a DC output that has characteristics (e.g., 12V, etc.) that are suitable for a device to which power is being supplied (not shown in FIG. 2 for clarity). The DC output is transmitted to a device by way of wire 10. It will be appreciated that an embodiment is equally applicable for use in connection with any type of electrical device that requires an external AC power adaptor.

It can be seen in FIG. 2 that power circuitry 240 is located within compartment 201. Compartment 201 is bounded by portions of housing 210 and heat transfer plate 230. Housing may be comprised of any material that is suitable for housing external AC power adaptor 200. It will be appreciated that plastic is commonly used in such applications because of its physical strength and low cost, but an embodiment is not limited to the use of plastic in connection with housing 210, as any suitable material may be used. Heat transfer plate 230 may be comprised of any material that is a suitable conductor of heat. For example, heat transfer plate 230 may be fabricated from metal, which has good thermal conductivity for such an application. It will be appreciated that if heat transfer plate 230 is fabricated from metal, or any other material that is also a good electrical conductor, then some or all of power circuitry 240 may need to be electrically isolated from heat transfer plate 230 for safety reasons. Such isolation may be effectuated using insulation such as electrically non-conductive thermal transfer sheets or pads (not shown in FIG. 2 for clarity), or the like.

To provide cooling for power circuitry 240, such circuitry 240 may, in an embodiment, by thermally coupled to heat transfer plate 230 using a thermally-conductive adhesive or the like. Housing 210 may be formed such that one or more openings 215 may be present to allow air within compartment 202 to circulate across heat transfer plate 230 and therefore cool power circuitry 240. To provide for enhanced cooling, heat sink 232 may be thermally coupled to heat transfer plate 230. Heat sink 232 may be formed in any configuration that is suitable for the intended application, and may have fins or the like for increasing cooling. For safety purposes, heat transfer plate 230 may be electrically earth-grounded, attached to a secondary return, etc.

In addition to or in place of heat sink 232, fan 231 may be located within compartment 202 to provide forced air cooling, represented in FIG. 2 by air flow A. Fan 231 may be any type of air-moving device including, but not limited to, bladed fans, centrifugal blowers, and the like. In embodiments that employ fan 231, it will be appreciated that additional safety measures may need to be taken. For example, fan 231 may receive power (e.g., 12V) from the DC output of adaptor 200, instead of using the AC input, which entails a much higher risk of injury. Additional safety features may also be used such as, for example, fan 231 control circuitry that can affect a shutoff in the event of a short-circuit, contact with liquid, obstruction of one or more openings 215, or the like.

As may be appreciated, having openings 215 in housing 210 could compromise the safety of adaptor 200 if proper precautions are not taken. According to an embodiment, therefore, heat transfer plate 230 and housing 210 may be fixedly coupled in such a manner as to prevent unintended access to power circuitry 240. Such coupling may be facilitated by fasteners, adhesives or the like. Alternatively, heat transfer plate 230 may couple to housing 210 using an interference fit, overlapping seams, or the like. In yet another alternative, some combination of the above techniques may be employed to couple heat transfer plate 230 to housing 210. In an alternate embodiment, heat transfer plate 230 may be coupled to a component of adaptor 200 other than, or in addition to, housing 210. It will be appreciated that any such configuration is equally consistent with an embodiment provided that power circuitry 240 is suitably isolated for safety purposes. What constitutes suitable isolation of power circuitry 240 may depend on safety regulations and/or the intended application, but in one embodiment physical intrusion into compartment 201 containing power circuitry 240 should be prevented. In another embodiment, compartment 201 is sealed to the point of being air- and/or watertight.

Figure 3:
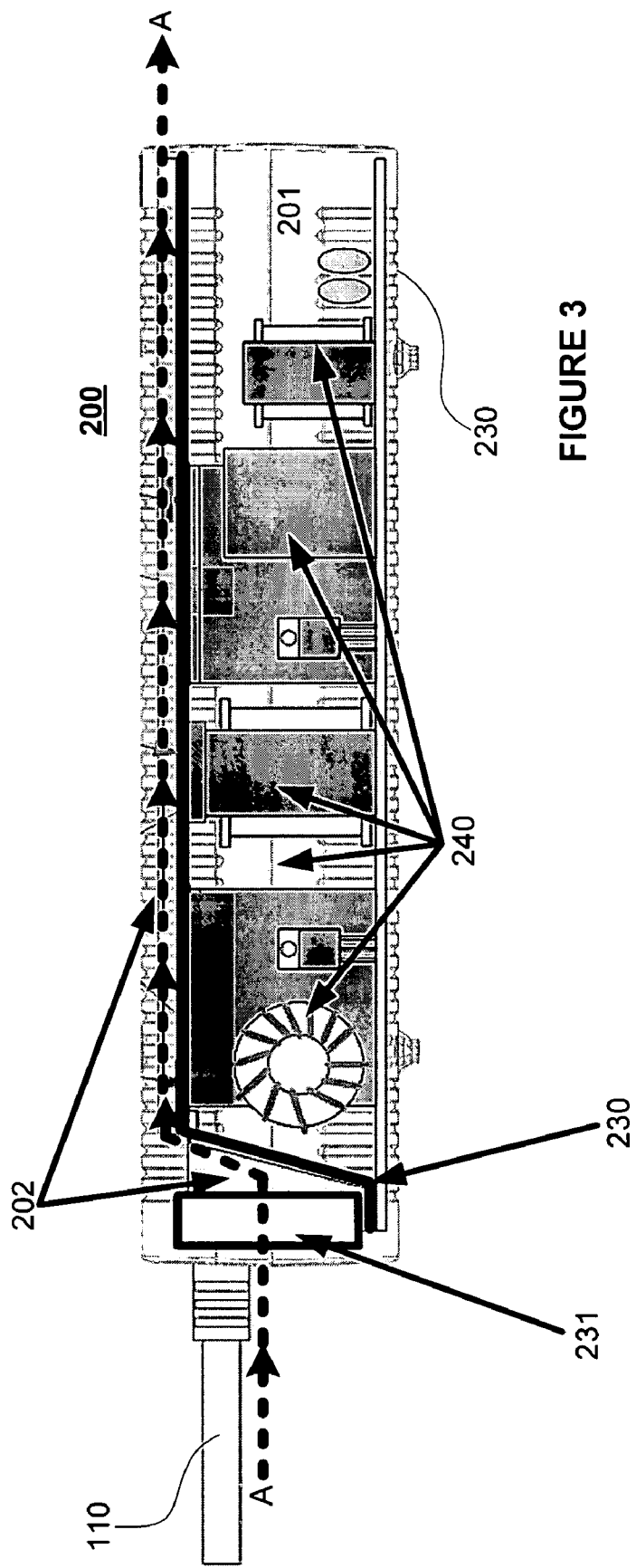
FIG. 3 is a diagram illustrating a cutaway view of an external AC power adaptor in accordance with an embodiment of the present invention.

Now that an external AC power adaptor 200 of an embodiment has been discussed, it should be appreciated that any number of configurations of such a two-compartment design may be provided while remaining consistent with an embodiment. For example, FIG. 3 illustrates an external AC power adaptor 200 having an axially-positioned fan 231, and compartment 202 that is formed around compartment 201. Referring now to FIG. 3, it can be seen that various components of power circuitry 240 are contained within compartment 201. As was the case above in connection with FIG. 2, the DC output of adaptor 200 is transmitted to a device (not shown in FIG. 3 for clarity) by way of wire 110.

Fan 231 is mounted axially and proximate an end of adaptor 200 (e.g., in the "end-cap" of housing 210) to generate airflow represented by arrow A, which flows across heat transfer plate 230, thereby cooling power circuitry 240. Such airflow enters and exits through openings (that may be in the form of vents or the like) formed in housing 210. Heat transfer plate 230 defines a boundary between compartments 201 and 202 by being formed around power circuitry 240. Thus, it will be appreciated that heat transfer plate 230 may take any shape and can define compartments 201 and 202 of any size within adaptor 200. It will also be appreciated that the airflow may be facilitated by any number of additional components of adaptor 200. For example, a cowl (e.g., a slanted portion of heat transfer plate 230) may serve to direct the airflow such than air flows in a desired direction.

Figure 4:
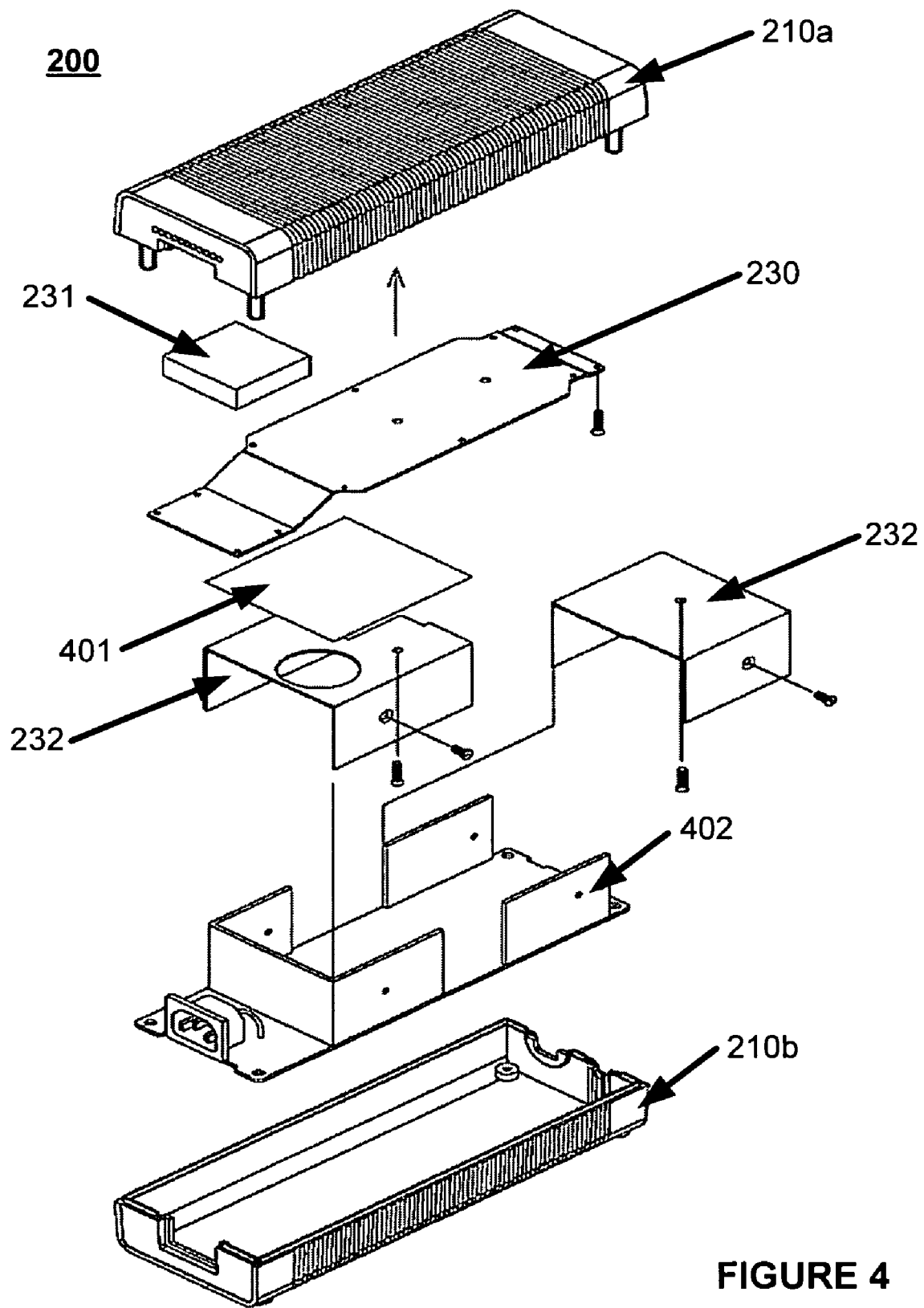
FIG. 4 is a diagram illustrating an exploded view of an external AC power adaptor in accordance with an embodiment of the present invention.

FIG. 4 illustrates an exploded view of another example embodiment of the present invention. In the embodiment illustrated in FIG. 4, fan 231, such as fan 231 discussed above in connection with FIGS. 2-3, may be mounted horizontally within adaptor 200 to provide forced air circulation through compartment 202 (not shown in FIG. 4 for clarity) and over heat transfer plate 230. It will be appreciated from the different orientations and locations of fan 231 in FIGS. 3 and 4 that fan 231, heat transfer plate 230, etc., may be configured in any number of ways while remaining consistent with an embodiment.

As can be seen in FIG. 4, a power module 402 provides a platform for power circuitry (not shown in FIG. 4 for clarity) to which heat sinks 232 may be coupled. It will be appreciated that heat sinks 232 are located within compartment 201 (not shown in FIG. 4 for clarity) to provide increased heat transfer to heat transfer plate 230. Such heat sinks 232 may be in place of or in addition to any heat sinks that may be located in compartment 202. Insulator 401 electrically isolates power circuitry from heat transfer plate 230 for safety purposes, as was discussed above in connection with FIG. 2.

Although not shown in FIG. 4 for clarity, any number and shape of openings may be formed in, or defined by, housing 201a-b. Such openings may be positioned so as to provide a desired level of airflow past heat transfer plate 230. In one embodiment, for example, openings are positioned proximate fan 231 and proximate an opposite end of adaptor 200. It can be seen that FIG. 4 illustrates an embodiment where housing 210 is divided into two parts: 210a and 210b. In such an embodiment, housing parts 210a-b may be coupled by way of an interference fit, fasteners (e.g., screws, bolts, adhesives and/or the like), and so forth.

While the present invention has been described in connection with the embodiments of the various figures, it is to be understood that other similar embodiments may be used or modifications and additions may be made to the described embodiment for performing the same function of the present invention without deviating therefrom. Therefore, the present invention should not be limited to any single embodiment, but rather should be construed in breadth and scope in accordance with the appended claims.

What is claimed:

1. An external AC power adaptor, comprising:
   a housing defining a first and second compartment, wherein power circuitry for converting an AC input to a DC output is disposed within the first compartment;
   an opening formed in the housing proximate the second compartment; and
   a heat transfer plate disposed between the first and second compartments, wherein the opening and heat transfer plate facilitate air flow cooling of the adaptor without air flowing through the first compartment.

2. The adaptor of claim 1, farther comprising a fan for forcing air across the heat transfer plate through the opening.

3. The adaptor of claim 2, wherein the fan is powered by the DC output of the power circuitry.

4. The adaptor of claim 2, further comprising fan control circuitry.

5. The adaptor of claim 4, wherein the fan control circuitry shuts off the fan in the event of a short circuit or a blockage of the opening.

6. The adaptor of claim 5, wherein the housing has a longitudinal axis, and wherein the fan is oriented axially within the housing.

7. The adaptor of claim 5, wherein the fan is oriented horizontally within the housing.

8. The adaptor of claim 1, further comprising a heat sink thermally coupled to the heat transfer plate.

9. The adaptor of claim 8, wherein the heat sink is located in the first compartment and is thermally coupled to the power circuitry.

10. The adapter of claim 1, wherein the heat transfer plate is electrically insulated from the power circuitry.

11. The adapter of claim 1, wherein the heat transfer plate is operatively coupled to the housing to enclose the first compartment.

12. An external AC power adaptor, comprising:
    a housing defining a first and second compartment, wherein power circuitry for converting an AC input to a DC output is disposed within the first compartment;
    a first and second opening defined by the housing and proximate the second compartment;
    a heat transfer plate disposed substantially between the first and second compartments, wherein the heat transfer plate is operatively coupled to the housing to enclose the first compartment and is thermally coupled to the power circuitry; and
    a fan for moving air into the second compartment from the first opening, across the heat transfer plate and out of the second compartment through the second opening, wherein the first and second openings, heat transfer plate and the fan facilitate air flow cooling of the adaptor without air flowing through the first compartment.

13. The adaptor of claim 12, wherein the housing is formed from two portions, and wherein the portions are adapted to be operatively coupled to enclose the first and second compartments.

14. The adaptor of claim 12, wherein a heat sink is thermally coupled to the heat transfer plate.

15. The adaptor of claim 12, wherein the fan is powered by the DC output.

16. An apparatus comprising:
    an external AC power adaptor having a cooling compartment formed within the adaptor, wherein a portion of the cooling compartment is defined by a heat transfer plate that is thermally coupled to power circuitry of the adaptor contained within a power circuitry compartment; and
    a fan for forcing air across the heat transfer plate through the cooling compartment to cool the adaptor without air flowing through the power circuitry compartment.

17. The apparatus of claim 16, wherein the fan is powered by a DC output of the adaptor.

18. The apparatus of claim 16, wherein the heat transfer plate is adapted to couple to a housing of the adaptor to enclose the power circuitry.

19. The apparatus of claim 16, further comprising a heat sink disposed within the cooling compartment and thermally coupled to the heat transfer plate.

20. The apparatus of claim 19, further comprising an opening in the cooling compartment that is defined by the housing.

* * * * *

UNITED STATES PATENT AND TRADEMARK OFFICE
CERTIFICATE OF CORRECTION

PATENT NO. : 7,436,661 B2  
APPLICATION NO. : 11/126702  
DATED : October 14, 2008  
INVENTOR(S) : Chee Kiong Fong et al.

Page 1 of 1

It is certified that error appears in the above-identified patent and that said Letters Patent is hereby corrected as shown below:

In column 5, line 59, in Claim 2, delete "farther" and insert -- further --, therefor.

Signed and Sealed this  
Third Day of May, 2011

David J. Kappos  
*Director of the United States Patent and Trademark Office*